United States Patent
Sasaki

(10) Patent No.: US 9,911,493 B2
(45) Date of Patent: Mar. 6, 2018

(54) SEMICONDUCTOR MEMORY DEVICE INCLUDING SEMI-SELECTABLE MEMORY CELLS

(71) Applicant: TOSHIBA MEMORY CORPORATION, Minato-ku (JP)

(72) Inventor: Takahiko Sasaki, Nerima (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/066,229

(22) Filed: Mar. 10, 2016

(65) Prior Publication Data
US 2016/0322102 A1 Nov. 3, 2016

Related U.S. Application Data

(60) Provisional application No. 62/155,637, filed on May 1, 2015.

(51) Int. Cl.
*G11C 11/00* (2006.01)
*G11C 13/00* (2006.01)

(52) U.S. Cl.
CPC ........ *G11C 13/0069* (2013.01); *G11C 13/004* (2013.01); *G11C 13/0023* (2013.01); *G11C 13/0026* (2013.01); *G11C 2013/0054* (2013.01); *G11C 2213/71* (2013.01); *G11C 2213/78* (2013.01); *G11C 2213/79* (2013.01)

(58) Field of Classification Search
CPC ............ G11C 13/0007; G11C 13/0069; G11C 2213/71; G11C 13/0004; G11C 13/004; G11C 13/0002; G11C 13/0011; G11C 2213/72; G11C 2213/73; G11C 13/0064; G11C 11/16; G11C 2013/0054; G11C 13/0014; G11C 13/0097; G11C 7/14; G11C 13/00
See application file for complete search history.

(56) References Cited

U.S. PATENT DOCUMENTS

2007/0140009 A1* 6/2007 Ito ...................... G11C 16/0491
365/185.16
2012/0257437 A1* 10/2012 Seko ................... G11C 11/5678
365/148

(Continued)

FOREIGN PATENT DOCUMENTS

JP 2014-220482 11/2014

*Primary Examiner* — Hien Nguyen
(74) *Attorney, Agent, or Firm* — Oblon, McClelland, Maier & Neustadt, L.L.P.

(57) ABSTRACT

A semiconductor memory device includes a memory cell array having first wires, a second wire, and memory cells connected to the first and second wires, and a control circuit that can apply writing voltages to the second wire. One of the memory cells connected to the selected second wire and a selected first wire is a selected memory cell. One of the memory cells connected to the selected second wire and an unselected first wire is a semi-selected memory cell. When writing data into the selected memory cell, the control circuit selects one from the writing voltages and applies the one writing voltage to a third wire connected to the selected second wire. The control circuit selects the one writing voltage, based on a first current flowing through the second wire when each of the memory cells connected to the selected second wire are set as semi-selected memory cells.

20 Claims, 5 Drawing Sheets

(56) References Cited

U.S. PATENT DOCUMENTS

| | | |
|---|---|---|
| 2013/0250655 A1* | 9/2013 | Sugimae ............ G11C 13/0069 365/148 |
| 2013/0294136 A1 | 11/2013 | Siau et al. |
| 2014/0326939 A1 | 11/2014 | Yamato et al. |
| 2015/0103613 A1 | 4/2015 | Schubert et al. |

* cited by examiner

| TFT VARIATION | PROGRAM SCHEME | MCh disturb [V] |
|---|---|---|
| NO | WL→BL | 1.39 |
| NO | BL→WL | 1.49 |
| PRESENT | WL→BL | 1.533 |
| PRESENT | BL→WL | 1.64 |

# SEMICONDUCTOR MEMORY DEVICE INCLUDING SEMI-SELECTABLE MEMORY CELLS

CROSS-REFERENCE TO RELATED APPLICATIONS

This application is based upon and claims the benefit of priority from the prior U.S. Provisional Application 62/155,637, filed on May 1, 2015, the entire contents of which are incorporated herein by reference.

BACKGROUND

Field

An embodiment of the present invention relates to semiconductor memory devices.

Description of the Related Art

Variable-resistance memories (resistance RAMs [ReRAMs]) are one type of semiconductor memory devices that replace low-cost and large-capacity flash memories known in the art. A variable-resistance memory has memory cells each formed with a variable resistance film, and configures a cross-point memory cell array, allowing for the same level of capacity as flash memories. To further expand the capacity, some developed ReRAMs employ a so-called vertical bit line (VBL) structure, in which selection lines, or bit lines, are arrayed vertically with respect to the semiconductor substrate.

DETAILED DESCRIPTION

Figure 1:
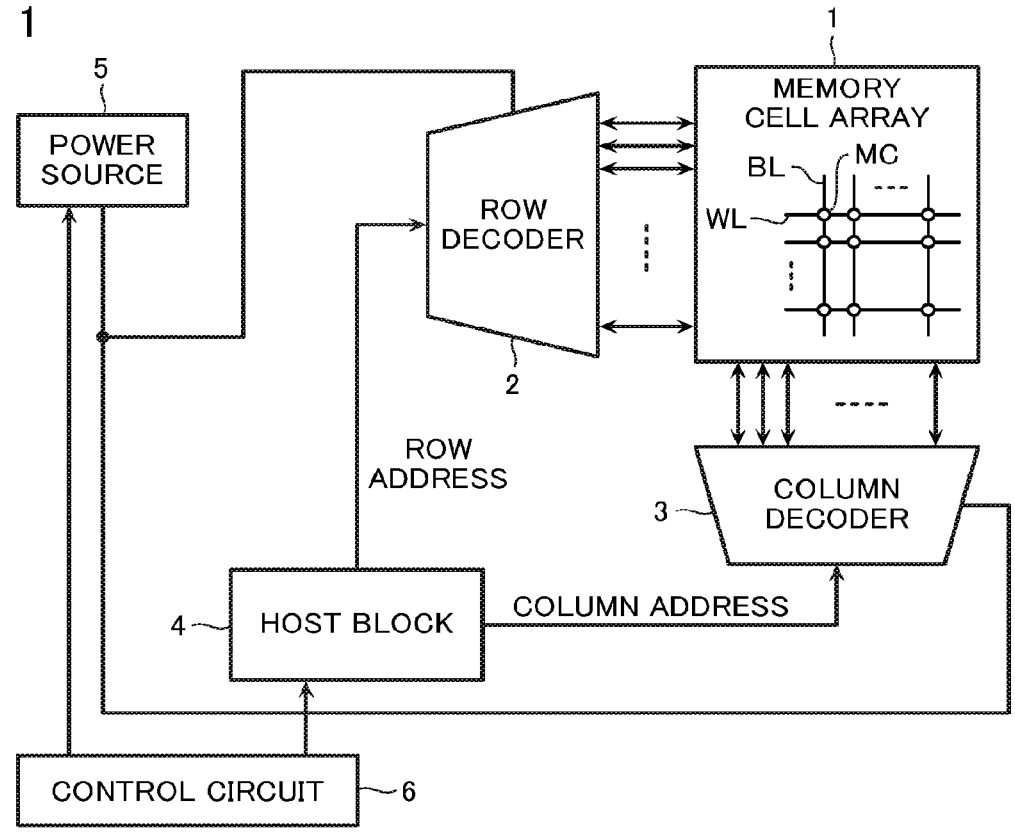
FIG. 1 is a functional block diagram of a semiconductor memory device according to an embodiment.

A semiconductor memory device according to an embodiment includes: a memory cell array having a plurality of first wires, a second wire, and a plurality of memory cells electrically connected to the plurality of first wires and the second wire; and a control circuit configured to apply a plurality of writing voltages to the second wire. One of the memory cells is a selected memory cell, which is electrically connected to the selected second wire and electrically connected to a selected one of the first wires. One of the memory cells is a semi-selected memory cell, which is electrically connected to the selected second wire and electrically connected to an unselected one of the first wires. When writing data into the selected memory cell, the control circuit selects one from the plurality of writing voltages and applies the one writing voltage to a third wire connected to the selected second wire. Further, the control circuit selects the one writing voltage on the basis of a first current that flows through the second wire when each of the plurality of memory cells electrically connected to the selected second wire is set as the semi-selected memory cell.

A semiconductor memory device according to an embodiment will be described below with reference to the accompanying drawings.

The semiconductor memory device in this embodiment includes a memory cell array 1, a row decoder 2, a column decoder 3, a host block 4, a power source 5, and a control circuit 6.

The memory cell array 1 includes: a plurality of word lines WL and a plurality of bit lines BL that cross one another; and a plurality of memory cells MC arranged at the intersections of the word lines WL and the bit lines BL. The row decoder 2 selects one of the word lines WL during an access operation. The column decoder 3 selects one of the bit lines BL during an access operation and has a driver that controls this access operation.

The host block 4 selects an access target from the memory cells MC in the memory cell array 1. The host block 4 applies a row address to the row decoder 2 and a column address to the column decoder 3. The power source 5, during a data writing/reading operation, generates a predetermined combination of voltages corresponding to this operation, and supplies it to both the row decoder 2 and the column decoder 3. The control circuit 6 controls the host block 4, for example, by transmitting an address thereto in response to an external command, and also controls the power source 5.

Next, details of the memory cell array 1 will be described.

Figure 2:
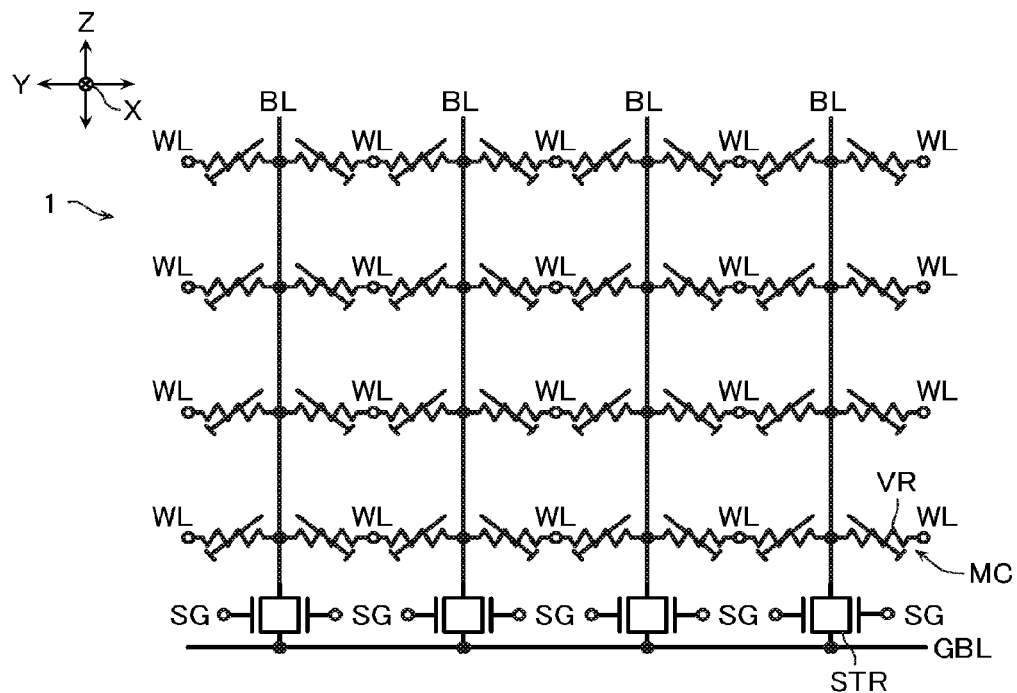
FIG. 2 is a circuit diagram of the memory cell array in the semiconductor memory device according to the embodiment.
Figure 3:
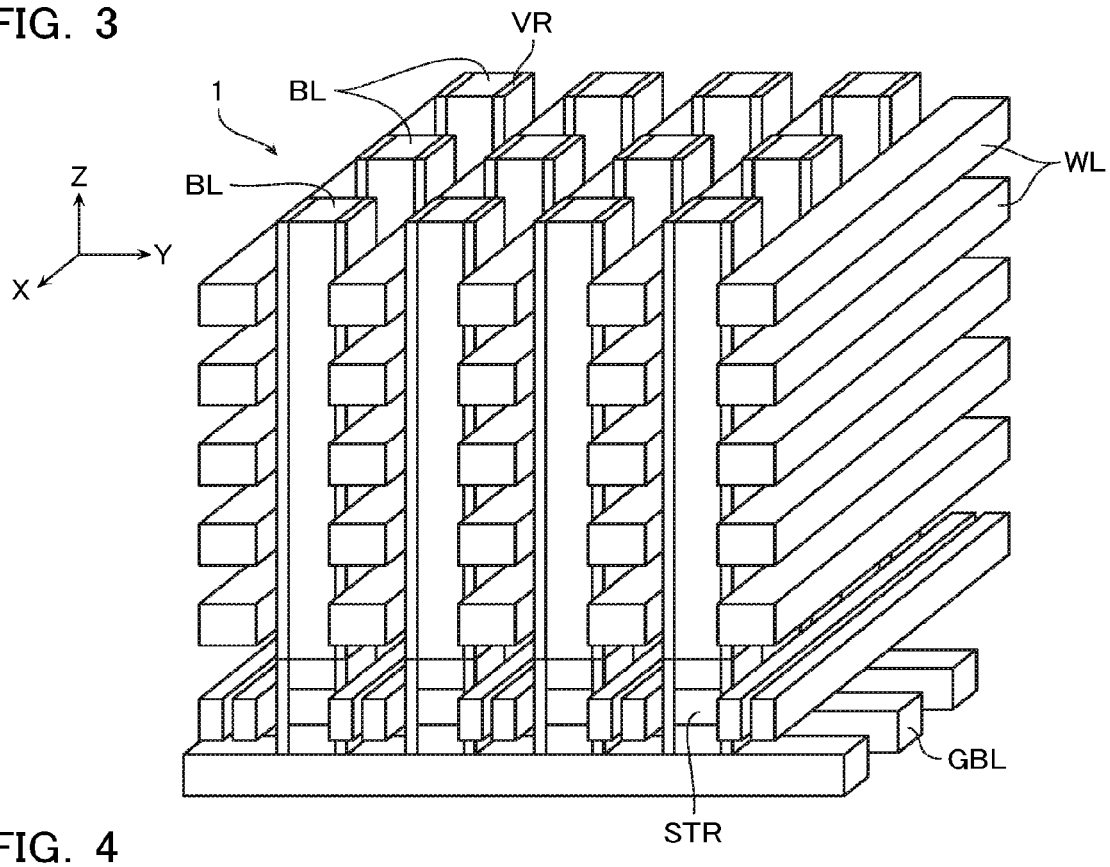
FIG. 3 is a perspective view illustrating the structure of the memory cell array in the semiconductor memory device according to the embodiment.

FIG. 2 is a circuit diagram of the memory cell array in the semiconductor memory device according to this embodiment. FIG. 3 is a perspective view illustrating the structure of the memory cell array in the semiconductor memory device.

As illustrated in FIG. 2, components of the memory cell array 1 include, in addition to the word lines WL, bit lines BL, and memory cells MC described above, selection transistors STR, global bit lines GBL, and selection gate lines SG. Herein, a single second wire includes a bit line BL and a global bit line GBL.

As illustrated in FIG. 3, the memory cell array 1 employs a so-called vertical bit line (VBL) structure, in which the bit lines BL extend vertically with respect to the principal plane of the semiconductor substrate (not illustrated). More specifically, the word lines WL are arrayed in both the Y and Z directions in a matrix fashion while extending in the X direction. The bit lines BL are arrayed in the X and Y directions in a matrix fashion while extending in the Z direction. The memory cells MC are arranged at the intersections of the word lines WL and the bit lines BL, namely, arrayed in the X, Y, and Z directions in a 3D matrix fashion.

As illustrated in FIG. 2, each memory cell MC has a variable resistive element VR (variable resistance film). The variable resistive element VR transits between a high-resistance state and a low-resistance state in accordance with an applied voltage. Each memory cell MC stores data in a nonvolatile manner by utilizing the resistance state of the variable resistive element VR. The variable resistive element VR typically performs a set operation and a reset operation.

In the set operation, the variable resistive element VR transits from the high-resistance state (reset state) to the low-resistance state (set state); in the reset operation, it transmits from the low-resistance state (set state) to the high-resistance state (reset state). In addition, the variable resistive element VR performs a forming operation necessary only immediately after its fabrication. In this forming operation, a local region (filament path) in which current flows easily is formed in the variable resistive element VR. More specifically, a voltage higher than that for the set or reset operation is applied across the variable resistive element VR.

As illustrated in FIG. 2, the selection transistors STR are formed at the lower ends of the bit lines BL and between the global bit lines GBL. The global bit lines GBL are arrayed in the X direction while extending in the Y direction. Each global bit line GBL is connected commonly to the ends of a plurality of selection transistors STR arrayed in the Y direction.

Two selection transistors STR arranged adjacent to each other in the Y direction may share a common gate. The selection gate lines SG, which function as the gates of the selection transistors STR, are arrayed in the Y direction while extending in the X direction. Each selection gate line SG is connected commonly to the gates of a plurality of selection transistors STR arrayed in the X direction. Alternatively, two selection transistors STR arranged adjacent to each other in the Y direction may have separated gates and operate independently.

Next, a description will be given of an operation of writing data into the semiconductor memory device.

The data writing operation involves the set and reset operations described above. The following description will be given regarding an exemplary case where the reset operation is performed; however the set operation may be performed instead.

Figure 4:
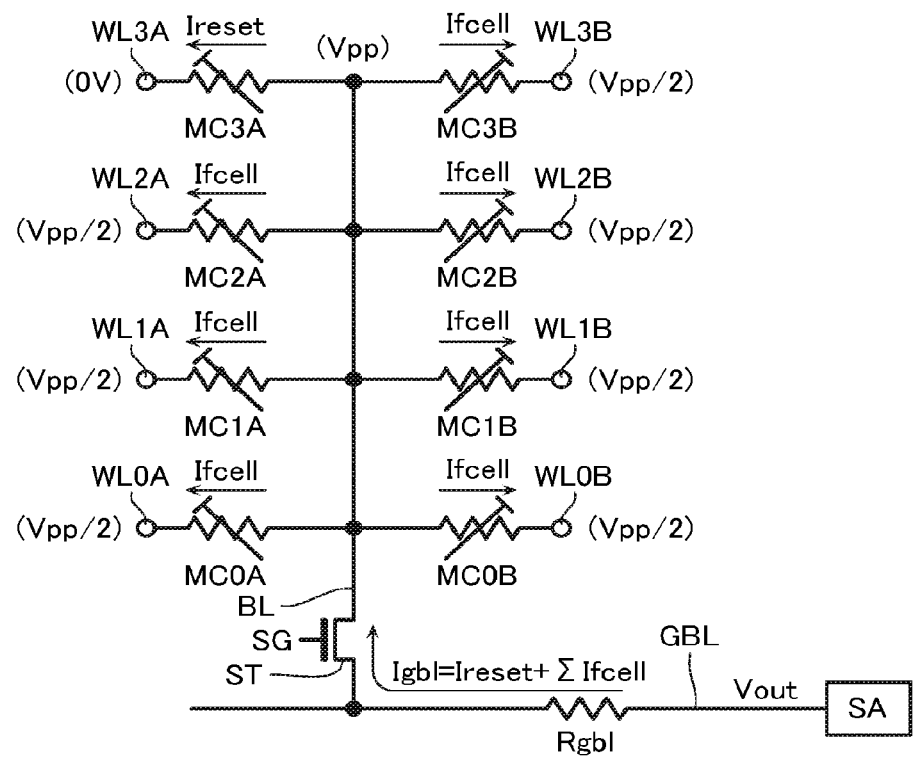
FIG. 4 is a circuit diagram of the memory cell array being biased in the semiconductor memory device according to the embodiment during a data writing operation.

FIG. 4 is a circuit diagram of the memory cell array being biased in the semiconductor memory device according to this embodiment during a data writing operation.

Specifically, FIG. 4 illustrates a plurality of word lines WL, a single bit line BL, and a plurality of memory cells MC connected to the intersections between the word lines WL and the bit line BL. Furthermore, it illustrates a sense amplifier circuit SA, a global bit line GBL connected to this sense amplifier circuit SA, and a selection transistor STR formed between the bit line BL and the global bit line GBL. The global bit line GBL has a wire resistance Rgbl.

In the following description, suppose a word line WL3A is a selected word line (also denoted below by WLs) and the remaining word lines WL are unselected word lines. Moreover, suppose the bit line BL is a selected bit line, a memory cell MC3A connected between the word line WL3A and the bit line BL is a selected memory cell (also denoted below by MCs), and the remaining memory cells MC are unselected memory cells. When one of a word line WL connected to the memory cell MC and the bit line BL connected to the memory cell MC is a selected wire, the memory cell MC connected is referred to as a semi-selected memory cell (also denoted below by MCf). A semi-selected memory cells connected to the selected bit line BL may be referred to as an F cell among other semi-selected memory cells MCf. In FIG. 4, all the unselected memory cells are F cells accordingly. The variable resistive element VR in each memory cell MC performs the reset operation when a program voltage Vpp is applied thereto.

In order for the memory cell MC3A to perform the reset operation, for example, the sense amplifier circuit SA applies 0 V to the selected word line WL3A and a voltage Vpp/2, which corresponds to a half of the program voltage Vpp, to the unselected word lines WL. Here, suppose the parasitic resistance, such as the wire resistance Rgbl, of the global bit line GBL is ignored. When the sense amplifier circuit SA applies the program voltage Vpp to the global bit line GBL, this program voltage Vpp is applied to the memory cell MC3A, and then the memory cell MC3A performs the reset operation. On the other hand, the remaining memory cells MC to which the voltage Vpp/2 is applied does not perform the reset operation.

Next, consider the influence of a voltage drop (also referred to below as an IR drop) caused by the wire resistance Rgbl. The IR drop in the circuit of FIG. 4 is caused mainly by an insufficient drive performance of the thin film transistor, hereinafter referred to as TFT, forming the selection transistor STR and a long, narrow shape of the global bit line GBL. In order for the selected memory cell MCs to reliably perform the reset operation, the sense amplifier circuit SA needs to apply the program voltage Vpp to the bit line BL. More specifically, assuming that a voltage drop, or an IR drop, of a voltage Vird occurs in the global bit line GBL, the sense amplifier circuit SA needs to apply an output voltage Vout (=Vpp+Vird) to the global bit line GBL.

The above voltage Vird depends on, for example, the resistance state of the semi-selected memory cells MCh. In addition, a current Igbl flowing through the global bit line GBL corresponds to the sum (Ireset+ΣIfcell) of a reset current Ireset flowing through the selected memory cell MCs and cell currents Ifcell flowing through the semi-selected memory cells MC. A disturbance voltage applied to the semi-selected memory cells MCh corresponds to a half of the program voltage Vpp applied to the selected memory cell MCs as described above. However, as the number of semi-selected memory cells MCf (2×the number of layers of the word line WL−1) increases, the current ΣIfcell becomes dominant in the current Igbl. For this reason, the voltage drop Vird, or the IR drop, depends greatly on the resistance state of the semi-selected memory cells MCh, or data stored in the semi-selected memory cells MC.

In light of the above, when the selected memory cell MCs performs the reset operation, the sense amplifier circuit SA applies, to the global bit line GBL, a writing voltage Vwr that has been assumed that the voltage Vird is maximized, or all the semi-selected memory cells MCh are in the low-resistance state. However, when the writing voltage Vwr is applied, if some of the semi-selected memory cells MCh are in the high-resistance state, the IR drop may occur less than assumed. As a result, not only a voltage higher than the program voltage Vpp would be applied to the selected memory cell MCs, but also a disturbance voltage higher than the voltage Vpp/2 would be applied to the unselected memory cells MCh. This increases a risk that a heavy load is placed on the selected memory cell MCs and data in the semi-selected memory cells MCh is damaged.

A result of simulating the disturbance voltage applied to the semi-selected memory cells MCf (F cells) will be described below.

Figures 5, 6:
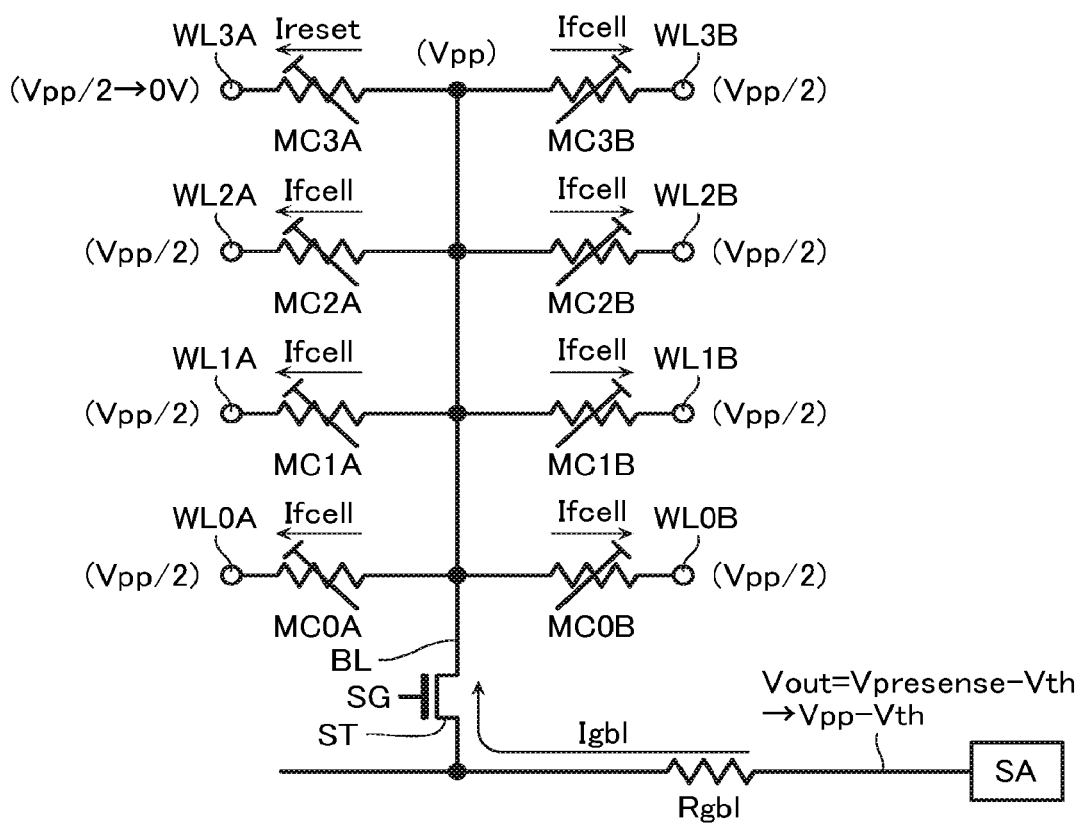
FIG. 5 is a table showing a disturbance voltage applied to semi-selected memory cells in the semiconductor memory device during the data writing operation.
FIG. 6 is a circuit diagram of the memory cell array being biased in the semiconductor memory device according to the embodiment during the data writing operation.

FIG. 5 is a table showing the disturbance voltage applied to the semi-selected memory cells in the semiconductor memory device during a data writing operation. The table shows a simulation result of the maximum of the disturbance voltages applied to the semi-selected memory cells MCh. The difference of individual disturbance voltages are attributed to characteristic variations in the TFTs forming the selection transistors STR and a program scheme to be employed. In this case, two program schemes are employed; the first one is to select the word line WL and the bit line BL in this order and the second one is to select the bit line BL and the word line WL in this order. The simulation values in the table are calculated under the condition that the word line WL has 16 layers, the program voltage Vpp is 2 V, and a variation in voltages ☐Vth of the TFTs forming the selection transistors STR is about +250 mV.

Under an ideal condition, the disturbance voltage applied to each semi-selected memory cell MCh becomes Vpp/2 (1V), as described above. The table of FIG. 5, however, reveals that when all the semi-selected memory cells MCh are in the low-resistance state, the disturbance voltage applied to the semi-selected memory cells MCh exceeds 1 V. More specifically, when the characteristics of the TFTs vary and the program scheme to select the bit line BL and the word lines WL in this order is employed, the disturbance voltage of as high as 1.64 V is applied to a semi-selected memory cell MCh. When a higher disturbance voltage is applied to a semi-selected memory cell MCh, not only a heavy load is placed on the semi-selected memory cells MCh but also the transition of its resistance state may be caused.

To avoid the above disadvantage, this embodiment performs a data writing operation in the following manner.

The data writing operation in this embodiment includes a pre-sensing operation of identifying the resistance states of the semi-selected memory cells MCf (F cells) and a program operation of causing the selected memory cell MCs to perform the set or reset operation. Specifically, first the pre-sensing operation is performed, and then the program operation is performed.

FIG. 6 is a circuit diagram of the memory cell array being biased in the semiconductor memory device according to this embodiment during the data writing operation. Here, when voltage values in the pre-sensing operation differ from those in the program operation, these voltage values are shown together.

In the pre-sensing operation, the sense amplifier circuit SA applies the voltage Vpp/2 to all the word lines WL including the selected word line WL3A, setting them as unselected word lines WL. Simultaneously, the sense amplifier circuit SA applies the program voltage Vpp to the bit line BL, setting it as a selected bit line BL. All the memory cells connected to the bit line BL are thereby set as semi-selected memory cells MCh. In this case, as described above, the amount of current Igbl flowing through the global bit line GBL depends on the resistance states of the semi-selected memory cells MCh. Thus, by sensing the amount of current Igbl flowing through the global bit line GBL, the present resistance states of the semi-selected memory cells MCh can be identified. It should be noted that in this pre-sensing operation, the sense amplifier circuit SA applies, to the global bit line GBL, an output voltage Vout lower than that for the program operation. This can prevent the semi-selected memory cells MCh from bearing a heavy load during the pre-sensing operation.

The sense amplifier circuit SA adjusts the output voltage Vout to be used for the program operation, on the basis of the amount of current Igbl sensed during the pre-sensing operation. Specifically, when a small current Igbl flows, or if many semi-selected memory cells MCh are in the high-resistance state, the sense amplifier circuit SA applies a relatively low output voltage Vout. When a large current Igbl flows, or if many semi-selected memory cells MCh are in the low-resistance state, the sense amplifier circuit SA applies a relatively high output voltage Vout. In this way, the sense amplifier circuit SA in the embodiment selects an appropriate one of a plurality of output voltages Vout on the basis of the amount of current Igbl sensed during the pre-sensing operation. In this program operation, therefore, it is possible to apply an appropriate program voltage Vpp to the selected memory cell MCs and apply a reduced disturbance voltage to the semi-selected memory cells MCh.

Next, a description will be given of an exemplary configuration of the sense amplifier circuit SA which performs both the pre-sensing and program operations.

Figure 7:
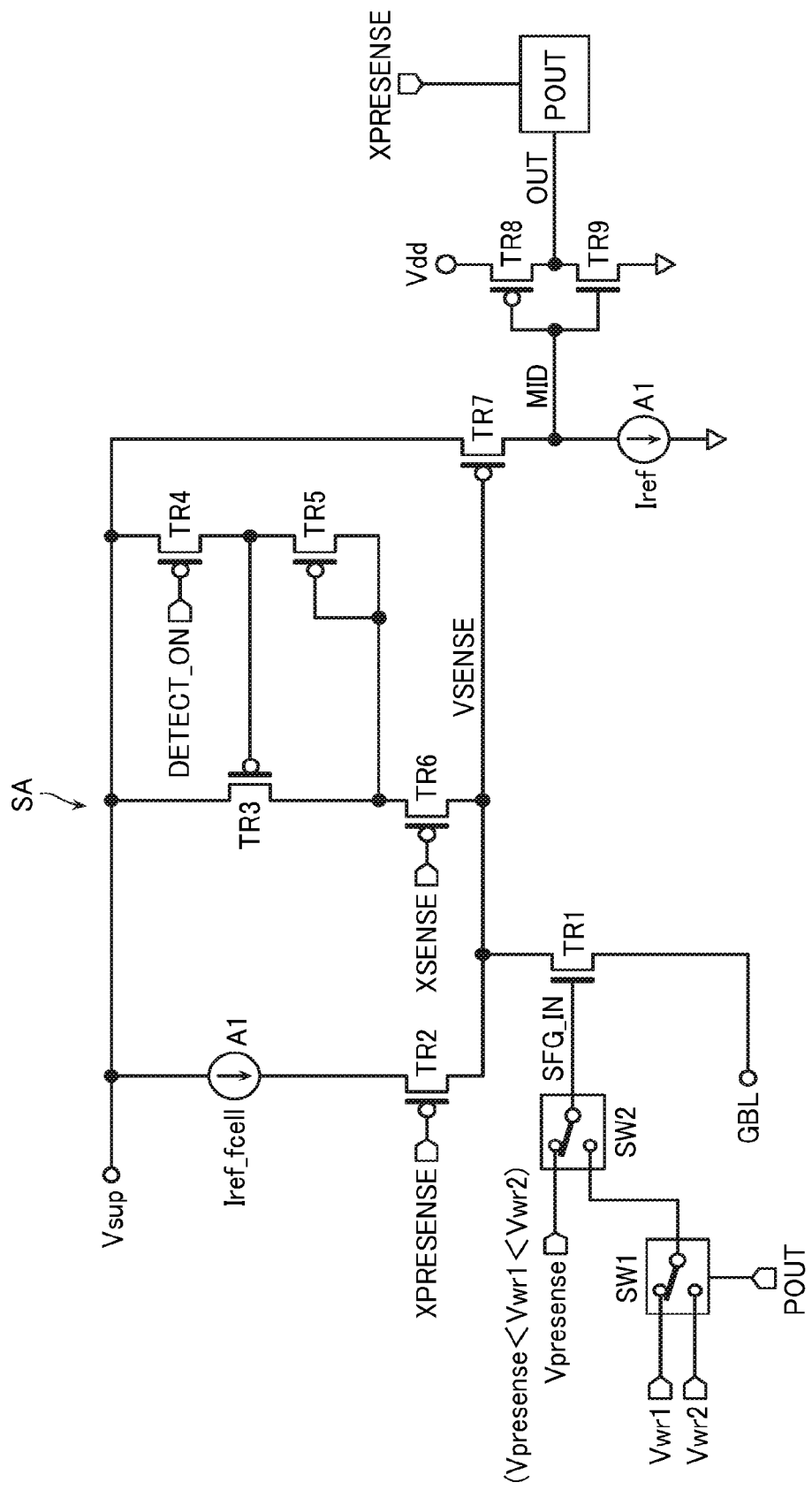
FIG. 7 is a circuit diagram of the sense amplifier circuit in the semiconductor memory device according to the embodiment.

FIG. 7 is a circuit diagram of the sense amplifier circuit in the semiconductor memory device according to this embodiment.

The sense amplifier circuit SA includes transistors TR1 to TR9, switching circuits SW1 and SW2, constant current sources A1 and A2, and a latch circuit L1.

The transistor TR1 is an NMOS transistor having a source, a drain, and a gate that are connected, respectively, to a node VSENSE, the global bit line GBL, and a node SFG_IN.

The transistor TR2 is a PMOS transistor having a source connected to a predetermined power source Vsup via the constant current source A1, a drain connected to the node VSENSE, and a gate that receives a control signal XPRESENSE. The constant current source A1 feeds a reference current Iref_fcell that is used as a reference to determine the amount of current Igbl during the pre-sensing operation. The control signal XPRESENSE is a negative logic signal for use in giving the period of sensing the current Igbl during the pre-sensing operation.

For example, the reference current Iref_fcell may be set to the current flowing through the global bit line GBL when a half of all the memory cells MC, among other memory cells MC connected to the bit lines BL, are in the low-resistance state.

The transistor TR3 is a PMOS transistor having a source connected to the power source Vsup. The transistor TR4 is a PMOS transistor having a source connected to the power source Vsup, a drain connected to the gate of the transistor TR3, and a gate that receives a control signal DETECT_ON. The transistor TR5 is a PMOS transistor having a source connected to the drain of the transistor TR4 and a drain and a gate that are both connected to the drain of the transistor TR3. The transistors TR3 to TR5 configure a peak sensing circuit that senses the peak of the current Igbl and is controlled in accordance with the control signal DETECT_ON.

The transistor TR6 is a PMOS transistor having a source connected to the drains of the transistors TR3 and TR5, a drain connected to the node VSENSE, and a gate that receives a control signal XSENSE. The control signal XSENSE is a negative logic signal for use in giving the period of sensing the current Igbl during the program operation.

The transistor TR7 is a PMOS transistor having a source connected to the power source Vsup, a drain connected to the power source ground via the constant current source A2, and a gate connected to the node VSENSE. The drain of the transistor TR7 forms a node MID. The constant current source A2 feeds a reference current Iref that is used as a reference to determine whether the current Igbl is high or low during the program operation.

The transistor TR8 is a PMOS transistor having a source and a gate that are connected, respectively, to a predetermined power source Vdd and the node MID. The transistor TR9 is an NMOS transistor having a source, a drain, and a gate that are connected to the drain of the transistor TR8, the power source ground, and the node MID, respectively. Both the drain of the transistor TR8 and the source of the transistor TR9 form a node OUT. Both the transistors TR8 and TR9 configure a NOT circuit having an input terminal at the MID node and an output terminal at the OUT node.

The latch circuit L1 has an input terminal at the node OUT, and is controlled in accordance with the control signal XPRESENSE. While receiving a control signal XPRESENSE of "L," the latch circuit L1 is capturing a signal from the node OUT. When the control signal XPRESENSE becomes "H," it retains the signal captured from the node OUT as data POUT.

The switching circuit SW1 chooses between a writing voltage Vwr1 (e.g., 3.5 V) and a writing voltage Vwr2 (e.g., 4V) and outputs the chosen one. The switching circuit SW1 is controlled in accordance with the retained data POUT in the latch circuit L1. The switching circuit SW2 chooses between a pre-sensing voltage Vpresense (e.g., 3V) and the output from the switching circuit SW1, namely, the writing voltage Vwr1 or Vwr2, and outputs a chosen one. The output from switching circuit SW2 at the node SFG_IN controls the transistor TR1.

In the pre-sensing operation, the switching circuit SW2 chooses the pre-sensing voltage Vpresense. The output voltage Vout (=Vpresense−Vth) is thereby applied to the global bit line GBL; Vth denotes the threshold voltage of the transistor TR1. In the program operation, the switching circuit SW1 chooses between the writing voltages Vwr1 and Vwr2. The output voltage Vout (=Vwr1−Vth or Vwr2−Vth) is thereby applied to the global bit line GBL.

Next, a description will be given of an operation of the sense amplifier circuit SA in this embodiment.

Figure 8:
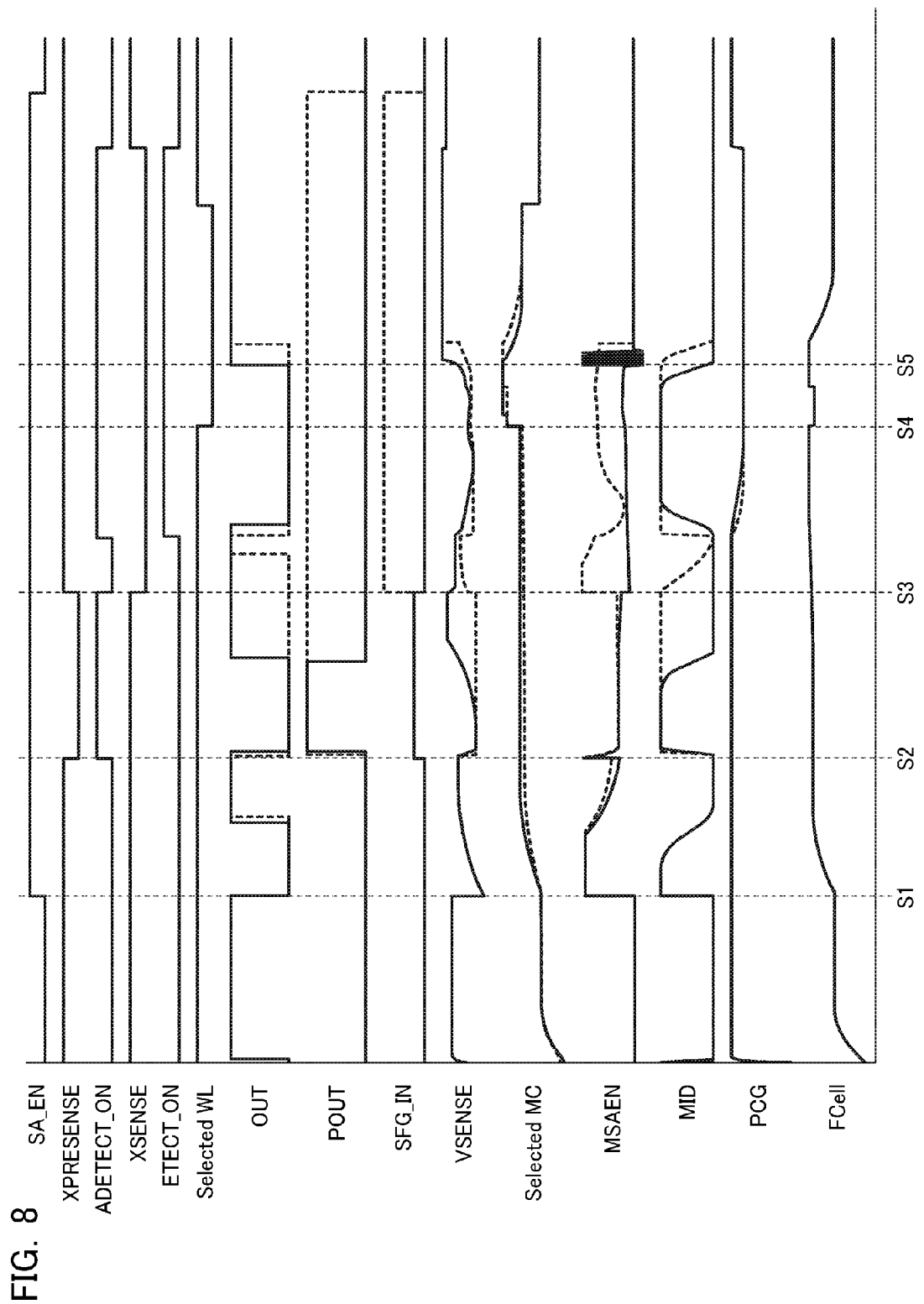
FIG. 8 is a timing chart showing operational waveforms of the sense amplifier circuit in the semiconductor memory device according to the embodiment.

FIG. 8 is a timing chart showing operational waveforms of the sense amplifier circuit in the semiconductor memory device according to the embodiment. In this timing chart, the waveforms drawn by a solid line represent operations when many semi-selected memory cells MCh are in the high-resistance state, whereas the waveforms drawn by a dashed line represent operations when many semi-selected memory cells MCh are in the low-resistance state. Furthermore, "Selected WL," "Selected MC" and "FCell" correspond to the voltages applied to the selected word line WLs, the selected memory cell, and the semi-selected memory cells (F cell), respectively.

When the data writing operation starts, a control signal SA_EN (not illustrated in FIG. 7) rises from "L" to "H" at Step S1, activating the sense amplifier circuit SA. In this case, the switching circuit SW2 chooses the pre-sensing voltage Vpresense. The output voltage Vout (=Vresense−Vth) is thereby applied to the global bit line GBL, and then a voltage of about Vpp is applied to the bit line BL. Consequently, the disturbance voltage Vpp/2 (=1V) is applied to all the memory cells MC including a memory cell MC that will be selected later, so that all the memory cells MC are set as the semi-selected memory cells.

At Step S2, the control signal XPRESENSE rises from "H" to "L", turning on the transistor TR2. The difference between the current Igbl and the reference current Iref_fcell thereby appears at the node VSENSE. If the current Igbl is larger than the reference current Iref_fcell, the transistor TR7 turns on, causing the potential at the node MID to be "H." If the current Igbl is smaller than the reference current Iref_fcell, the transistor TR7 turns off, causing the potential at the node MID to be "L." In this way, whether the amount of current Igbl relative to the amount of reference current Iref_fcell is high or low appears at the node OUT.

At Step S3, when the control signal XPRESENSE rises from "L" to "H," the latch circuit L1 retains the potential at the node OUT as the data POUT. Simultaneously with this, the control signal XSENSE falls from "H" to "L", and the switching circuits SW1 and SW2 thereby perform switching operations. Specifically, the switching circuit SW1 is controlled in accordance with the data POUT retained by the latch circuit L1. When the data POUT is "H," namely, the current Igbl is larger than the reference current Iref_fcell, the switching circuit SW1 chooses the writing voltage Vpp2. When the data POUT is "L," namely, the current Igbl is smaller than the reference current Iref_fcell, the switching circuit SW1 chooses the writing voltage Vpp1, which is smaller than the writing voltage Vpp2. Then, the switching circuit SW1 outputs the chosen writing voltage to the node SFG_IN. As a result, the output voltage Vout (=Vpp1−Vth or Vpp2−Vth) is applied to the global bit line GBL in the case in which Vth denotes the threshold voltage of the transistor TR1.

At Step S4, the voltage applied to the selected word line WLs falls from Vpp/2 to 0 V. In response to this, the voltage applied to the selected memory cell MCs rises to the program voltage Vpp, which is required to perform the reset operation.

At Step S5, the selected memory cell MCs transits from the low-resistance state to the high-resistance state during the reset operation. In response, the potential at the node VSENSE rises. Then, the change in the potential at the node VSENSE is detected, after which the data writing operation ends.

The description has been given of the summary of the operation performed by the sense amplifier circuit SA in this embodiment.

The foregoing embodiment identifies the resistance states of semi-selected memory cells through a pre-sensing operation. This makes it possible to lower the disturbance voltage applied to the semi-selected memory cells in the writing operation and to prevent a selected memory cell from being energized with an excessively high program voltage. Therefore, this embodiment successfully provides a semiconductor memory device that is capable of performing a highly reliable data writing operation.

Other Embodiments

Some embodiments of the present invention which have been described are exemplary and not intended to limit the scope of the invention. Novel embodiments as described above can be carried out in different ways and can undergo various omissions, replacements, and modifications that do not depart from the scope of the invention. The embodiments and their modifications are included within the scope and spirit of the invention, and further included within the scopes of the inventions recited in the claims and their equivalents.

What is claimed is:
1. A semiconductor memory device comprising:
a memory cell array having a plurality of first wires, a second wire, and a plurality of memory cells electrically connected to the respective first wires and the second wire; and
a control circuit configured to perform a writing operation in which data is written into the memory cells, wherein one of the memory cells is a selected memory cell, which is electrically connected to a selected one of the first wires and the second wire, one of the memory cells is a semi-selected memory cell, which is electrically connected to an unselected one of the first wires and the second wire, and before performing the writing operation for the selected memory cell, the control circuit performs a pre-sensing operation in which an amount of first current flowing through the second wire is determined when a voltage is applied to the second wire and the plurality of first wires connected to the second wire via the memory cells, the voltage being a voltage to be applied when the plurality of memory cells including the selected memory cell connected to the second wire is set as the semi-selected memory cells.

2. The semiconductor memory device according to claim 1, wherein, when performing the writing operation for one of the memory cells, the control circuit controls a voltage applied to the second wire on the basis of the amount of first current.

3. The semiconductor memory device according to claim 1, wherein the control circuit:
has a reference current source configured to feed a reference current, and
determines the amount of the first current by comparing the first current with the reference current during the pre-sensing operation.

4. The semiconductor memory device according to claim 1, wherein the control circuit:
has a latch circuit, and
retains a result of determining the amount of first current in the latch circuit during the pre-sensing operation.

5. The semiconductor memory device according to claim 1, wherein
the plurality of first wires extend laterally with respect to a principal plane of a semiconductor substrate, and
the second wire extends vertically with respect to the principal plane of the semiconductor substrate.

6. The semiconductor memory device according to claim 1, wherein
the memory cell array has a third wire electrically connected to the second wire,
the control circuit is configured to apply a plurality of writing voltages to the third wire, and
when performing the writing operation for the selected memory cell, the control circuit selects one from the plurality of writing voltages on the basis of the first current and applies the one writing voltage to the third wire connected to the second wire.

7. The semiconductor memory device according to claim 6, wherein the control circuit:
has a reference current source configured to feed a reference current, and
determines the amount of the first current by comparing the first current with the reference current.

8. The semiconductor memory device according to claim 7 wherein the control circuit has a latch circuit configured to retain a result of determining the amount of the first current.

9. The semiconductor memory device according to claim 8, wherein
the control circuit has a first switching circuit configured to select the one writing voltage, and
the first switching circuit is controlled in accordance with the determination result retained in the latch circuit.

10. The semiconductor memory device according to claim 6, wherein
when sensing the first current, the control circuit applies a pre-sensing voltage to the third wire connected to the second wire, and the pre-sensing voltage is lower than any of the plurality of writing voltages.

11. The semiconductor memory device according to claim 10, wherein the control circuit has a second switching circuit configured to select one of the plurality of writing voltages and the pre-sensing voltage.

12. The semiconductor memory device according to claim 6, wherein
the plurality of first wires extend laterally with respect to a principal plane of a semiconductor substrate, and
the second wire extends vertically with respect to the principal plane of the semiconductor substrate.

13. The semiconductor memory device according to claim 1 wherein
the memory cell array has a third wire electrically connected to the second wire,
the control circuit is configured to apply a first voltage, a second voltage, a plurality of third voltages, and a fourth voltage to the plurality of first wires and the third wire,
when performing a pre-sensing operation, the control circuit applies the second voltage to the plurality of first wires and applies the fourth voltage to the third wire connected to the wire to flow the first current through the second wire, and
when performing the wiring operation for the selected memory cell, the control circuit:
applies the first voltage to a selected one of the first wires,
applies the second voltage to another one of the first wires,
selects one from the plurality of third voltages on the basis of the first current, and
applies the one third voltage to the third wire connected to the second wire.

14. The semiconductor memory device according to claim 13, wherein the control circuit:
has a reference current source configured to feed a reference current, and
determines the amount of the first current by comparing the first current with the reference current.

15. The semiconductor memory device according to claim 14, wherein the control circuit has a latch circuit configured to retain a result of determining the amount of first current.

16. The semiconductor memory device according to claim 15, wherein
the control circuit has a first switching circuit configured to select the one third voltage, and
the first switching circuit is controlled in accordance with the determination result retained in the latch circuit.

17. The semiconductor memory device according to claim 13, wherein the control circuit has a second switching circuit configured to select one of the plurality of third voltages and the fourth voltage.

18. The semiconductor memory device according to claim 13, wherein the fourth voltage is lower than any of plurality of third voltages.

19. The semiconductor memory device according to claim 13, wherein
the plurality of first wires extend laterally with respect to a principal plane of a semiconductor substrate, and
the second wire extends vertically with respect to the principal plane of the semiconductor substrate.

20. The semiconductor memory device according to claim 13, wherein
the plurality of memory cells have variable resistance films formed between the respective first wires and the second wire, when the first voltage is applied to the first wires disposed at one ends of the variable resistance films and the one third voltage is applied to the third wire electrically connected to the second wire disposed at the other ends of the variable resistance films so that a potential difference is generated across the variable resistance films, the variable resistance films make a transition of their resistance states, and when the first voltage is applied to the first wires disposed at one ends of the variable resistance films and the second voltage is applied to the third wire electrically connected to the second wire disposed at the other ends of the variable resistance films so that a potential difference is generated across the variable resistance films, the variable resistance films maintain their resistance states.

\* \* \* \* \*